United States Patent
Arnold

(10) Patent No.: US 9,190,999 B2
(45) Date of Patent: Nov. 17, 2015

(54) TOUCH-SENSITIVE PUSHBUTTON SWITCH

(75) Inventor: Georg Arnold, Schwabach (DE)

(73) Assignee: Diehl AKO Stiftung & Co. KG, Wangen (DE)

( * ) Notice: Subject to any disclaimer, the term of this patent is extended or adjusted under 35 U.S.C. 154(b) by 2132 days.

(21) Appl. No.: 11/698,810

(22) Filed: Jan. 26, 2007

(65) Prior Publication Data

US 2007/0182717 A1     Aug. 9, 2007

(30) Foreign Application Priority Data

Feb. 1, 2006 (DE) .................. 10 2006 004 979

(51) Int. Cl.
*G09G 5/00*     (2006.01)
*H03K 17/96*     (2006.01)
*G01V 8/12*     (2006.01)

(52) U.S. Cl.
CPC .............. *H03K 17/9636* (2013.01); *G01V 8/12* (2013.01); *H03K 2217/94026* (2013.01); *H03K 2217/94116* (2013.01); *H03K 2217/96015* (2013.01)

(58) Field of Classification Search
None
See application file for complete search history.

(56) References Cited

U.S. PATENT DOCUMENTS

| | | | | |
|---|---|---|---|---|
| 4,701,747 A | * | 10/1987 | Isherwood et al. | ............. 341/24 |
| 6,835,923 B2 | * | 12/2004 | Hamalainen et al. | .... 250/227.11 |
| 2003/0094566 A1 | | 5/2003 | Hamalainen et al. | |

FOREIGN PATENT DOCUMENTS

| | | |
|---|---|---|
| DE | 36 11 988 C2 | 10/1986 |
| DE | 3611988 A1 | 10/1986 |
| DE | 40 07 971 A1 | 9/1991 |
| DE | 4007971 A1 | 9/1991 |
| EP | 0551240 A1 | 7/1993 |
| EP | 1 313 222 A1 | 5/2003 |
| EP | 1313222 A1 | 5/2003 |
| EP | 1 431 780 A2 | 6/2004 |
| EP | 1431780 A2 | 6/2004 |
| GB | 2 173 931 A | 10/1986 |
| WO | 2005071526 A2 | 8/2005 |
| WO | WO 2005/071526 A2 | 8/2005 |

\* cited by examiner

*Primary Examiner* — Seokyun Moon
(74) *Attorney, Agent, or Firm* — Laurence A. Greenberg; Werner H. Stemer; Ralph E. Locher

(57) ABSTRACT

A touch-sensitive pushbutton switch includes an optical sensor, in particular an infrared sensor, and an evaluation circuit. The evaluation circuit is able, through the use of a reference device, to set a sensitivity of the optical sensor in dependence on a detected basic level of an evaluation signal.

10 Claims, 2 Drawing Sheets

TOUCH-SENSITIVE PUSHBUTTON SWITCH

CROSS-REFERENCE TO RELATED APPLICATION

This application claims the priority, under 35 U.S.C. §119, of German Patent Application DE 10 2006 004 979.9, filed Feb. 1, 2006; the prior application is herewith incorporated by reference in its entirety.

BACKGROUND OF THE INVENTION

Field of the Invention

The present invention relates to a touch-sensitive pushbutton switch including an optical sensor, which contains an electromagnetic-radiation-emitting transmitter and an electro-magnetic-radiation-receiving receiver and which is disposed behind a covering that is at least partly transmissive to the electromagnetic radiation. An evaluation circuit evaluates a measurement signal which is generated by the receiver of the optical sensor and generates an evaluation signal. Such a pushbutton switch is intended to be used, in particular, in a control device for a domestic appliance.

The basic construction and the basic principle of such a touch-sensitive pushbutton switch are known from German Published, Non-Prosecuted Patent Application DE 40 07 971 A1, for example. That touch-sensitive pushbutton switch has an electromagnetic-radiation-emitting transmitter and an electromagnetic-radiation-receiving receiver, which are disposed behind a covering that is at least partly transmissive to the electromagnetic radiation. Furthermore, provision is generally made for an evaluation circuit for evaluating a measurement signal generated by the receiver and generating an evaluation signal for further processing. One advantageous application of such touch-sensitive pushbutton switches is, for example, use in control devices for domestic appliances, such as ranges or cookers, glass ceramic cool top platforms or cook tops or hobs, microwave ovens and the like, in which the pushbutton switch is accommodated behind a covering, such as a glass plate or glass ceramic plate, for example, for simple operation and cleaning.

In conventional pushbutton switches of that type, one problem is that different pushbutton switches in a control panel generally do not always react identically to one another, nor do they react in an unchanged manner over a relatively long period of time. That is due to various ambient influences and tolerance faults of its components, which may make it more difficult for a user to operate a control panel and may reduce the service life of the control panel.

SUMMARY OF THE INVENTION

It is accordingly an object of the invention to provide a touch-sensitive pushbutton switch, which overcomes the hereinafore-mentioned disadvantages of the heretofore-known devices of this general type and in which, in particular, a well-defined operability can be ensured even over a long period of time.

With the foregoing and other objects in view there is provided, in accordance with the invention, a touch-sensitive pushbutton switch, comprising a covering being at least partly transmissive to electromagnetic radiation. An optical sensor is disposed behind the covering and has an electromagnetic-radiation-emitting transmitter and an electromagnetic-radiation-receiving receiver. An evaluation circuit is provided for evaluating a measurement signal generated by the receiver and for generating an evaluation signal. A reference device is provided for conducting part of the electromagnetic radiation emitted by the transmitter to the receiver even without actuation of the pushbutton switch, and generating a basic level of the evaluation signal. The evaluation circuit sets a sensitivity of the optical sensor in dependence on a detection of the basic level of the evaluation signal.

By virtue of the above-described construction of the pushbutton switch, the receiver receives a small quantity of radiation even without the actuation of the pushbutton switch and thus generates a corresponding measurement signal from which a basic level of the evaluation signal is determined. The evaluation circuit then in each case sets a sensitivity of the optical sensor in dependence on the basic level of the evaluation signal thus detected. In this way, it is possible to ensure, for example, that all of the pushbutton switches in a control panel on one hand always have an identical sensitivity with respect to one another and on the other hand over a long period of time. It is possible, therefore, to eliminate temperature influences on the optical sensors of the pushbutton switches, to compensate for relatively large tolerances of the components of the optical sensor, to continuously adjust the pushbutton switches, and the like.

In accordance with another feature of the invention, the evaluation circuit sets a minimum swing of the evaluation signal necessary for identifying an actuation of the pushbutton switch, in dependence on the detected basic level of the evaluation signal, for example to a predetermined factor of a reference swing corresponding to the detected basic level.

In accordance with a further feature of the invention, the reference device has an at least partly transmissive passage opening in a partition of a diaphragm frame between the transmitter and the receiver. Therefore, part of the radiation emitted by the transmitter always passes directly through the passage opening to the receiver, independently of an actuation of the pushbutton switch.

In accordance with an added feature of the invention, alternatively, the covering for the reference device is formed in such a way that part of the radiation emitted by the transmitter is reflected at the front and/or the rear surface of the covering in the direction of the receiver. This may be achieved, for example, by the choice of a specific refractive index of the material of the covering, by a specific constitution of surfaces or by a specific coating of the surfaces of the covering.

In accordance with an additional feature of the invention, the reference device has both an at least partly transmissive passage opening in a partition of a diaphragm frame between the transmitter and the receiver and the covering which reflects part of the radiation emitted by the transmitter at its front and/or rear surface in the direction of the receiver.

In accordance with a concomitant feature of the invention, the radiation is infrared radiation.

Other features which are considered as characteristic for the invention are set forth in the appended claims.

Although the invention is illustrated and described herein as embodied in a touch-sensitive pushbutton switch, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
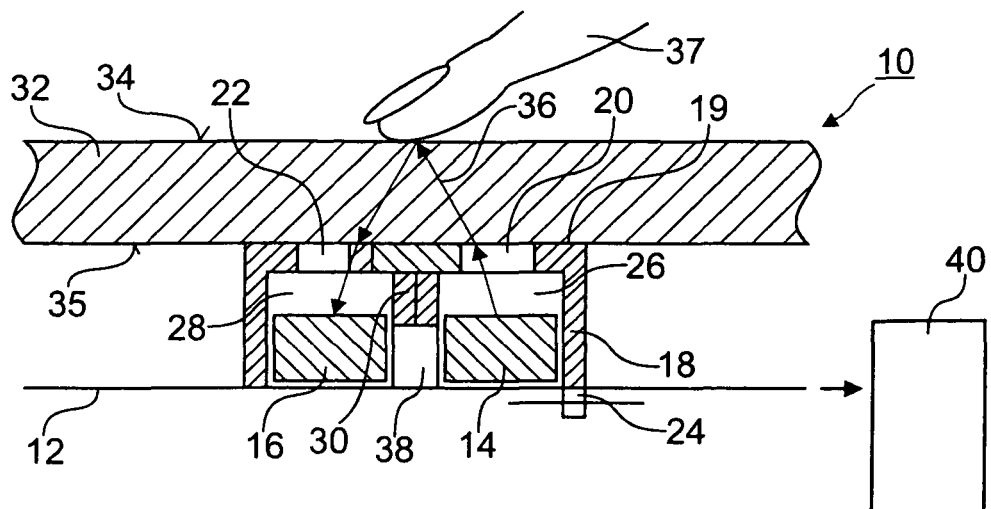
FIG. 1 is a fragmentary, diagrammatic, sectional view illustrating the construction of a touch-sensitive pushbutton switch in accordance with a preferred exemplary embodiment of the present invention.

Referring now to the figures of the drawings in detail and first, particularly, to FIG. 1 thereof, there is initially seen a mechanical construction of a touch-sensitive pushbutton switch 10 according to the invention. The touch-sensitive pushbutton switch of the invention is, for example, an infrared pushbutton switch for a domestic appliance such as a range, a microwave oven, a cool top platform or cook top, a washing machine, a tumble dryer, a dishwasher or the like, without the invention being restricted to electromagnetic radiation in any particular wavelength range or to these specific applications.

The touch-sensitive pushbutton switch 10 has an optical sensor with an infrared transmitter 14 and an infrared receiver 16, on a printed circuit board 12. The transmitter 14 and the receiver 16 are surrounded by a diaphragm frame 18 having two openings 20 and 22 at its top side 19. The diaphragm frame 18 is formed from an IR-opaque material and has feet 24 which are inserted through holes in the printed circuit board 12 and thus fixed to the latter.

The transmitter 14 and the receiver 16 are positioned in the diaphragm frame 18 in such a way that they are disposed within respective cavities 26 and 28 beneath the diaphragm openings 20 and 22. In this case, the two cavities 26 and 28 are separated from one another by an IR-opaque partition 30. A covering 32 made of a material that is at least partly transmissive to IR radiation, for example a glass ceramic plate of a domestic range, lies directly on the top side 19 of the diaphragm frame 18.

The radiation emitted by the transmitter 14 passes along an optical path 36 to a top side 34 of the covering 32. When the touch-sensitive pushbutton switch 10 is actuated by a finger 37 placed onto the surface of the covering 32, the radiation of the transmitter 14 is diffusely and multiply scattered, so that enough scattered radiation is reflected onto the receiver 16 and the latter transmits a corresponding measurement signal $V_E$ to an evaluation circuit 40 in order to initiate a corresponding switching function.

Figure 2:
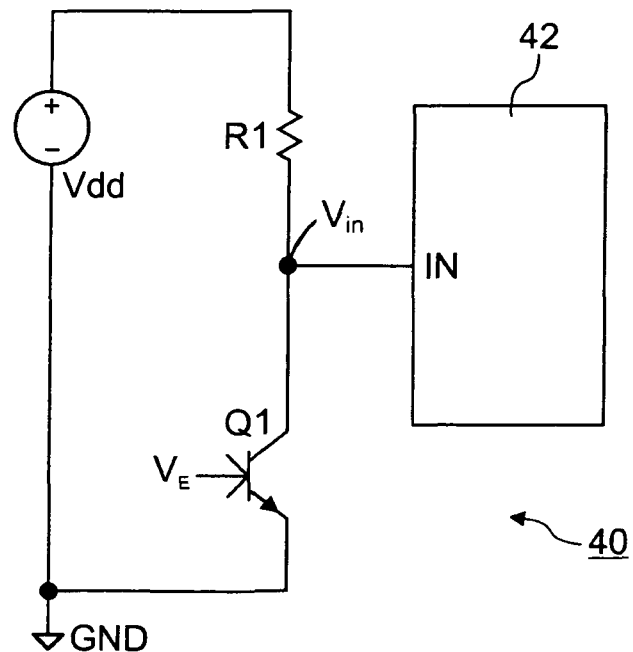
FIG. 2 is a simplified schematic circuit diagram of an evaluation circuit for the touch-sensitive pushbutton switch of FIG. 1.

The evaluation circuit 40, which corresponds in principle to an evaluation circuit of a conventional pushbutton switch, is illustrated in FIG. 2. A voltage divider circuit, to which a supply voltage Vdd is applied, is constructed from a first resister R1 and a first transistor Q1. The measurement signal $V_E$ of the receiver 16 switches the first transistor Q1. An evaluation signal $V_{IN}$ is tapped off between the first resister R1 and the first transistor Q1 and fed to an input IN of a microprocessor 42 for further processing.

In the case of a functional pushbutton switch 10, without actuation of the pushbutton switch 10, the first transistor Q1 is at high impedance, so that the evaluation signal $V_{IN}$ has a high signal level. When the pushbutton switch 10 is actuated, the first transistor Q1 is switched to a low impedance by the measurement signal $V_E$ of the receiver 16, so that the signal level of the evaluation signal $V_{IN}$ falls correspondingly, which the microprocessor 42 interprets as an actuation of the pushbutton switch 10.

Referring to FIG. 1 again, the partition 30 of the diaphragm frame 18 has a passage opening 38 that is at least partly transmissive to the electromagnetic radiation emitted by the transmitter 14. In addition or as an alternative, the top side 34 and/or an underside 35 of the covering 32 may be constituted or coated in such a way that at least part of the electromagnetic radiation of the transmitter 14 is reflected in the direction of the receiver 16. Therefore, the covering 32 and the passage opening 38 together form a reference device. What is achieved in this way is that, even without an actuation of the pushbutton switch 10 by a user, the receiver 16 receives a certain quantity of radiation from the transmitter 14 and generates a corresponding measurement signal $V_E$ for the evaluation circuit 40.

A signal profile of the evaluation signal $V_{IN}$ of the pushbutton switch 10 according to the invention will now firstly be described with reference to FIG. 3.

Figure 3:
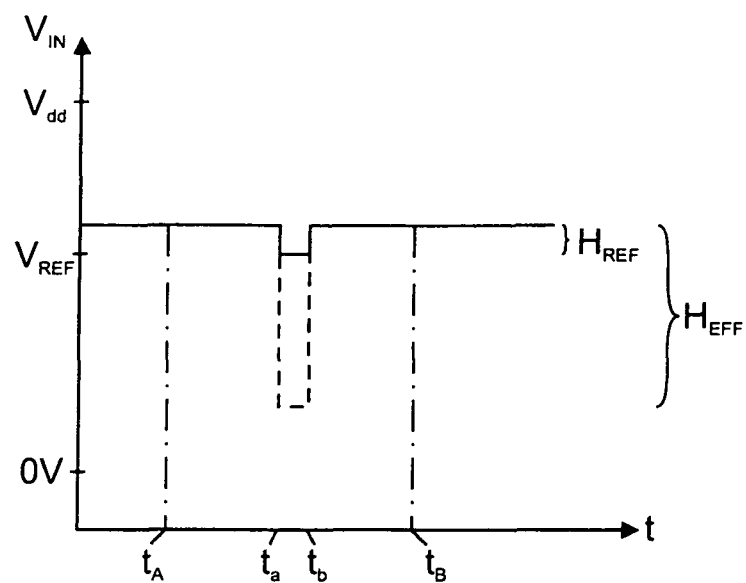
FIG. 3 is a signal diagram elucidating a signal profile of an evaluation signal of the evaluation circuit of FIG. 2.

As is illustrated in FIG. 3, the pushbutton switch 10 is evaluated in multiplex operation in a time window $t_A$ to $t_B$. Within that time window $t_A$-$t_B$ there exists a transmission clock cycle $t_a$-$t_b$ in which the transmitter 14 emits radiation. Outside the time window $t_A$-$t_B$, the multiplex operation is switched to other pushbutton switches in the control panel.

FIG. 3 shows, through the use of a solid line, the signal profile of an evaluation signal $V_{IN}$ without actuation of the pushbutton switch 10 (and without overshoot radiation of the pushbutton switch 10). As a reaction to the radiation emitted by the transmitter 14, the receiver 16 generates a measurement signal $V_E$ which, even without the actuation of the pushbutton switch 10, during the transmission clock cycle $t_a$-$t_b$, leads to a slight lowering (by a reference swing $H_{REF}$) of the evaluation signal $V_{IN}$ to a basic level $V_{REF}$. The basic level $V_{REF}$ is defined, for example, by a defined slot width of the passage opening 38 or through the use of a reflectivity of the top side 34 of the covering 32.

This lowering of the evaluation signal $V_{IN}$ is significantly more greatly pronounced in the case of a pushbutton switch actuation, as is indicated by a dashed signal profile in FIG. 3. A signal swing $H_{EFF}$ is significantly greater than the reference swing $H_{REF}$.

Figure 4:
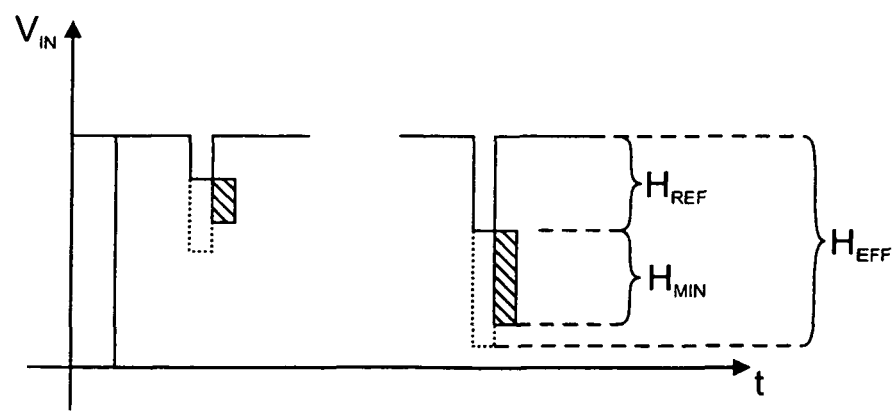
FIG. 4 is a signal diagram elucidating a setting of a sensitivity of an optical sensor of the touch-sensitive pushbutton switch of FIG. 1.

As is illustrated in FIG. 4, the signal swing $H_{EFF}$ generally depends proportionally on the present sensitivity of the pushbutton switch 10. In the case of a weak pushbutton switch 10 (on the left in FIG. 4), the signal swing $H_{EFF}$ in the event of an actuation of the pushbutton switch 10 is correspondingly smaller than in the case of a strong/sensitive pushbutton switch 10 (on the right in FIG. 4). This behavior equally holds true for the reference swing $H_{REF}$ of the evaluation signal $V_{IN}$, which is utilized as follows according to the invention.

In order to ensure that the microprocessor 42 identifies the actuation of the pushbutton switch 10, the signal swing $H_{EFF}$ of the evaluation signal $V_{IN}$ during the transmission clock cycle $t_a$-$t_b$ of the transmitter 14 of the optical sensor must exceed a specific minimum swing $H_{MIN}$. While the minimum swing $H_{MIN}$ is fixedly predetermined in the case of a conventional pushbutton switch, in the case of the present invention the minimum swing $H_{MIN}$ is presently adapted in each case, as is illustrated in FIG. 4.

In particular, the minimum swing $H_{MIN}$ necessary for identifying a pushbutton switch actuation is set in a manner dependent on the basic level $V_{REF}$ of the evaluation signal $V_{IN}$ that is detected according to the invention. In one exemplary embodiment, the minimum swing $H_{MIN}$ may be set to a specific factor (e.g. approximately a factor of 2 in FIG. 4) of the reference swing $H_{REF}$ corresponding to the basic level $V_{REF}$. As can be discerned in FIG. 4, in the case of a more sensitive pushbutton switch 10 it is therefore necessary to detect a larger signal swing $H_{EFF}$, in order to ensure that the microprocessor 42 identifies an actuation of the pushbutton switch 10, than in the case of a less sensitive pushbutton switch 10. In other words, despite properties that are actually different, the two pushbutton switches 10 react identically due to the adapted threshold $H_{MIN}$ for identification of button touching.

Such setting of the sensitivity of the optical sensor, more precisely of the minimum swing $H_{MIN}$ required for identifying a pushbutton switch actuation, through the use of software in the microprocessor 42, makes it possible, in a simple and reliable manner, to have the effect that all of the pushbutton switches in a control panel react identically for a user, which simplifies operability. Moreover, temperature influences and sensitivity tolerances or tolerance faults of the optical sensor can be eliminated or at least minimized since the pushbutton switch is continuously readjusted to a good button touching behavior.

Whereas the invention has been described above on the basis of a preferred exemplary embodiment with reference to the accompanying drawings, it is self-evident to the person skilled in the art that further variants and modifications thereof can also be implemented without departing from the scope of protection of the invention as defined by the appended claims.

By way of example, in the diagrams shown in FIGS. 2 to 4, the polarities can be interchanged without impairing the effects and advantages of the invention.

I claim:

1. A touch-sensitive pushbutton switch, comprising:
   a covering being at least partly transmissive to electromagnetic radiation;
   an optical sensor disposed behind said covering and having an electromagnetic-radiation-emitting transmitter and an electromagnetic-radiation-receiving receiver;
   an evaluation circuit for evaluating a measurement signal generated by said receiver and generating an evaluation signal; and
   a reference device for conducting a first portion of the electromagnetic radiation emitted by said transmitter to said receiver even without actuation of the pushbutton switch, and generating a basic level of the evaluation signal;
   said evaluation circuit setting a sensitivity of the optical sensor in dependence on a detection of the basic level of the evaluation signal;
   said reference device including a diaphragm frame formed with at least one opening allowing a second portion of the electromagnetic radiation emitted by said transmitter to reach said covering and to be reflected from said covering toward said receiver when the pushbutton switch is activated;
   said reference device including a partition disposed between said transmitter and said receiver, said partition separating said transmitter from said receiver, and said partition formed with an at least partly transmissive passage opening that conducts the first portion of the electromagnetic radiation emitted by said transmitter to said receiver without being reflected by said covering before reaching said receiver.

2. The pushbutton switch according to claim 1, wherein said evaluation circuit sets a minimum swing of the evaluation signal necessary for identifying an actuation of the pushbutton switch, in dependence on the detected basic level of the evaluation signal.

3. The pushbutton switch according to claim 2, wherein the minimum swing of the evaluation signal necessary for identifying an actuation of the pushbutton switch is set to a predetermined factor of a reference swing corresponding to the detected basic level.

4. The pushbutton switch according to claim 1, wherein said covering covers said reference device and has front and rear surfaces, and the second portion of the radiation emitted by said transmitter is reflected at least at one of said front or rear surfaces of said covering in direction of said receiver.

5. The pushbutton switch according to claim 1, wherein said covering covers said reference device and has front and rear surfaces, and the second portion of the radiation emitted by said transmitter is reflected at least at one of said front or rear surfaces of said covering in direction of said receiver.

6. The pushbutton switch according to claim 1, wherein the electromagnetic radiation emitted by said transmitter and received by said receiver is infrared radiation.

7. The pushbutton switch according to claim 1, wherein said partition is physically disposed between said transmitter and said receiver.

8. The pushbutton switch according to claim 1, wherein said partition is not parallel to said covering.

9. The pushbutton switch according to claim 1, wherein:
   said at least one opening formed in said diaphragm frame allows the second portion of the electromagnetic radiation emitted by said transmitter to reach said covering; and
   said diaphragm frame includes another opening that allows the second portion of the electromagnetic radiation emitted by said transmitter and reflected from said covering to reach said receiver when the pushbutton switch is activated.

10. The pushbutton switch according to claim 1, wherein said evaluation circuit initiates a switching function when said covering is actuated.

* * * * *